(12) United States Patent
Matsushita

(10) Patent No.: US 10,651,169 B2
(45) Date of Patent: May 12, 2020

(54) SEMICONDUCTOR DEVICE AND DIODE

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventor: Kenichi Matsushita, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/124,117

(22) Filed: Sep. 6, 2018

(65) Prior Publication Data

US 2019/0296009 A1 Sep. 26, 2019

(30) Foreign Application Priority Data

Mar. 20, 2018 (JP) ................................. 2018-053122

(51) Int. Cl.
*H01L 27/07* (2006.01)
*H01L 29/06* (2006.01)
(Continued)

(52) U.S. Cl.
CPC ...... *H01L 27/0716* (2013.01); *H01L 29/0611* (2013.01); *H01L 29/66143* (2013.01);
(Continued)

(58) Field of Classification Search
CPC ........... H01L 27/0716; H01L 29/66143; H01L 29/7395; H01L 29/66333; H01L 29/872; H01L 29/0611
See application file for complete search history.

(56) References Cited

U.S. PATENT DOCUMENTS 5,418,376 A * 5/1995 Muraoka ............. H01L 29/7392
257/136
5,894,140 A * 4/1999 Terasawa .......... H01L 29/66348
257/138
(Continued)

FOREIGN PATENT DOCUMENTS

JP 2003-298072 A 10/2003
JP 2014-112637 A 6/2014
(Continued)

*Primary Examiner* — Victor A Mandala
(74) *Attorney, Agent, or Firm* — Foley & Lardner LLP

(57) ABSTRACT

A semiconductor device has a first semiconductor region of a first conductivity type, a second semiconductor region of a second conductivity type, a first conductive layer disposed on a main surface of the first semiconductor region, and a second conductive layer disposed on a main surface of the second semiconductor region. The first conductive layer has a first diffusion layer of the first conductivity type, a plurality of second diffusion layers of the first conductivity type, the second diffusion layers having higher impurity concentration than the first diffusion layer, and a plurality of third diffusion layers of the first conductivity type that are included in the first semiconductor region, or are arranged apart from one another to contact the first and second semiconductor regions, the third diffusion layers being arranged apart from the plurality of second diffusion layers and having higher impurity concentration than the first diffusion layer.

17 Claims, 15 Drawing Sheets

(51) Int. Cl.
    *H01L 29/872*     (2006.01)
    *H01L 29/66*     (2006.01)
    *H01L 29/739*     (2006.01)

(52) U.S. Cl.
    CPC .... *H01L 29/66333* (2013.01); *H01L 29/7395* (2013.01); *H01L 29/872* (2013.01)

(56) References Cited

U.S. PATENT DOCUMENTS

| | | |
|---|---|---|
| 9,059,236 B2 | 6/2015 | Ogura et al. |
| 9,496,332 B1 | 11/2016 | Matsushita |
| 2013/0062723 A1* | 3/2013 | Henning ............ H01L 29/8611 257/484 |
| 2014/0231867 A1* | 8/2014 | Yamashita ............ H01L 29/872 257/140 |
| 2015/0318385 A1* | 11/2015 | Kameyama ........... H01L 29/861 257/140 |
| 2017/0018619 A1* | 1/2017 | Ku ...................... H01L 29/4236 |
| 2017/0025551 A1* | 1/2017 | Yamwong ........... H01L 29/8611 |
| 2017/0084611 A1* | 3/2017 | Iwasaki ............... H01L 29/7397 |
| 2017/0148786 A1 | 5/2017 | Matsushita et al. |

FOREIGN PATENT DOCUMENTS

| | | |
|---|---|---|
| JP | 2014-154849 A | 8/2014 |
| JP | 2017-050421 A | 3/2017 |
| JP | 2017-103456 A | 6/2017 |

\* cited by examiner

SEMICONDUCTOR DEVICE AND DIODE

CROSS REFERENCE TO RELATED APPLICATIONS

This application is based upon and claims the benefit of priority from the prior Japanese Patent Application No. 2018-53122, filed on Mar. 20, 2018, the entire contents of which are incorporated herein by reference.

FIELD

Embodiments of the present disclosure relate to a semiconductor device and a diode.

BACKGROUND

A power conversion apparatus, such as an inverter, uses a diode, referred to as an FWD (Free Wheeling Diode), and an IGBT (Insulated Gate Bipolar Transistor) which are combined into a power semiconductor device. The FWD is composed of an anode layer, which is a p-type semiconductor layer, and a cathode layer which is formed with a high-resistive semiconductor layer (an active layer, hereinafter) and an n-type semiconductor layer. At a state where a load having inductance is connected to the power conversion apparatus such as an inverter, when the IGBT is turned off, the current flows to the FWD connected in parallel to the inductance. In order to minimize power loss (steady loss) of the FWD, a forward voltage drop Vf of the FWD is required to be low. As carriers in the active layer increase, the forward voltage drop Vf is lowered more.

When the IGBT is turned on after the passage of a certain period of time, the free wheeling current flowing through the FWD decreases to turn off the FWD. In order to decrease a switching loss at the time of turn-off, a switching time is preferably short. However, in order to switch the FWD in a short time, carriers in the active layer are required to be discharged in a short time, which increases loss due to increase in current (reverse recovery current) for carrier discharge.

An MPS (Merged P-i-N/Schottky) diode is a diode of a small reverse recovery current. The MPS diode has an ohmic contact region and a Schottky contact region in its anode electrode. As the hole injection from the Schottky contact region is less, a reverse recovery current is smaller, which requires to lower the impurity concentration of the Schottky contact region. However, when the impurity concentration of the Schottky contact region is lowered at the time of turn-off, a depletion layer reaches the anode electrode, which causes a problem in that a rated breakdown voltage cannot be obtained.

In order to raise the breakdown voltage, it is desirable to restrict the spread of a depletion layer extending to the anode electrode side at the time of applying the reverse voltage. It is, for example, considered to provide a p-type stopper layer in an anode region. However, when the stopper layer is provided, the stopper layer becomes a barrier against electrons, so that carriers are charged in the active layer to increase the reverse recovery current.

As explained above, it is not easy to satisfy both of the requirements of higher breakdown voltage and smaller reverse recovery current.

DETAILED DESCRIPTION

According to the present embodiment, there is provided a semiconductor device comprising:

a first semiconductor region of a first conductivity type;

a second semiconductor region of a second conductivity type;

a first conductive layer disposed on a main surface of the first semiconductor region at an opposite side of a junction interface between the first and second semiconductor regions; and a second conductive layer disposed on a main surface of the second semiconductor region at an opposite side of the junction interface, wherein the first conductive layer comprises:

a first diffusion layer of the first conductivity type;

a plurality of second diffusion layers of the first conductivity type arranged apart from one another at portions of the first diffusion layer, the second diffusion layers having higher impurity concentration than the first diffusion layer; and a plurality of third diffusion layers of the first conductivity type that are included in the first semiconductor region, or are arranged apart from one another to contact the first and second semiconductor regions, the third diffusion layers being arranged apart from the plurality of second diffusion layers and having higher impurity concentration than the first diffusion layer.

The terms such as "parallel", "intersect", and "the same", and the values of, for example, length and angle, which define shape, geometrical condition, and the degree of shape and geometrical condition, used in the present specification, are not necessary be limited to their strict definitions, but are interpreted to include the range to the extent that a similar function can be expected.

First Embodiment

Figure 1:
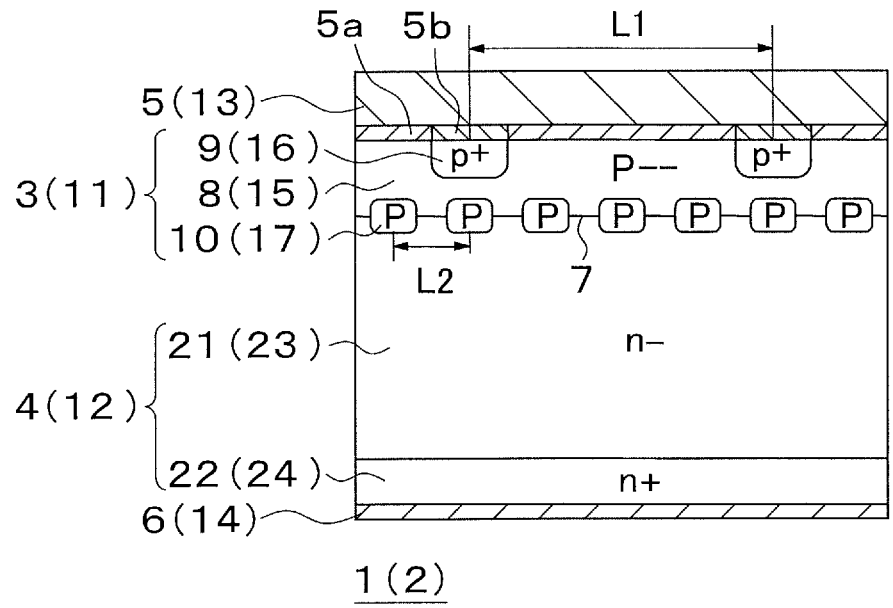
FIG. 1 is a sectional view of a semiconductor device according to a first embodiment.

FIG. 1 is a sectional view of a semiconductor device 1 according to a first embodiment. The semiconductor device 1 of FIG. 1 is, for example, a diode 2. The semiconductor device 1 of FIG. 1 is provided with a first semiconductor region 3 of a first conductivity type, a second semiconductor region 4 of a second conductivity type, a first conductive layer 5, and a second conductive layer 6.

The junction interface between the first semiconductor region 3 and the second semiconductor region 4 is, for example, a pn-junction interface 7. The first semiconductor region 3 is, for example, an anode region 11. The first conductivity type is, for example, a p-type. The second semiconductor region 4 is, for example, a cathode region 12. The second conductivity type is, for example, an n-type.

The first conductive layer 5 is disposed on a main surface of the first semiconductor region 3 at the opposite side of the junction interface between the first and second semiconductor regions 3 and 4. The first conductive layer 5, is for example, an anode electrode 13. The second conductive layer 6 is disposed on a main surface of the second semiconductor region 4 at the opposite side of the junction interface between the first and second semiconductor regions 3 and 4. The second conductive layer 6 is, for example, a cathode electrode 14.

The first semiconductor region 3 has a first diffusion layer 8 of the first conductivity type, a plurality of second diffusion layers 9 of the first conductivity type, and a plurality of third diffusion layers 10 of the first conductivity type. The first diffusion layer 8 of the first conductivity type is, for example, a p$^{--}$-type diffusion layer 15 of low concentration. The impurity concentration of the p$^{--}$-type diffusion layer 15 is set to be low so that a lot of holes are not injected from the p$^{--}$-type diffusion layer 15.

The plurality of second diffusion layers 9 are arranged apart from one another at portions of the first diffusion layer 8, each second diffusion layer 9 being a region of higher impurity concentration than the first diffusion layer 8. The second diffusion layers 9 are arranged in the vicinity of the one main surface of the first semiconductor region 3. The impurity concentration of the second diffusion layers 9 is set higher than the impurity concentration of the third diffusion layers 10. The second diffusion layers 9 are, for example, p$^{+}$-type diffusion layers 16 which are provided to adjust the amount of holes to be injected into the p$^{--}$-type diffusion layer 15.

One main surface of the first diffusion layer 8 includes the areas where the first diffusion layer 8 contacts the first conductive layer 5 and the places where the plurality of second diffusion layers 9 contact the first conductive layer 5. The areas where the first diffusion layer 8 contacts the first conductive layer 5 are a Schottky contact 5a whereas the areas where the plurality of second diffusion layers 9 contact the first conductive layer 5 are an ohmic contact 5b.

The plurality of third diffusion layers 10 are included in the first semiconductor region 3, or arranged apart from one another to contact the first and second semiconductor regions 3 and 4. Furthermore, the plurality of third diffusion layers 10 are arranged apart from the plurality of second diffusion layers 9, and regions of higher impurity concentration than the first diffusion layer 8. More specifically, the plurality of second diffusion layers 9 are arranged from a surface at the first conductive layer 5 side of the first diffusion layer 8 until a first depth. The plurality of third diffusion layers 10 are arranged from a second depth deeper than the first depth of the first diffusion layer 8 toward the second semiconductor region 4 side. The plurality of third diffusion layers 10 are, for example, p-type diffusion layers 17 which are provided to restrict the spread of a depletion layer from the pn-junction interface 7 toward the anode region 11. There are gaps each provided between successive p-type diffusion layers 17 to allow electrons from the cathode region 12 to pass through the gaps to enter the p$^{--}$-type diffusion layer 15.

The pitch L2 of the p-type diffusion layers 17 is smaller than the pitch L1 of the p$^{+}$-type diffusion layers 16. However, the pitch L2 of the p-type diffusion layers 17 is set irrespective of the pitch L1 of the p$^{+}$-type diffusion layers 16. Here, the pitches L1, L2 are the shortest distance between the centers of successive diffusion layers in the plane direction in a cross sectional surface.

The second semiconductor region 4 has an active layer 21 of the second conductivity type and a fourth diffusion layer 22 of the second conductivity type. The fourth diffusion layer 22 contacts the second conductive layer 6 at its one main surface. The active layer 21 of the second conductivity type is, for example, an n$^{-}$-type substrate layer 23. The fourth diffusion layer 22 is, for example, an n$^{+}$-type diffusion layer 24.

Figure 2:
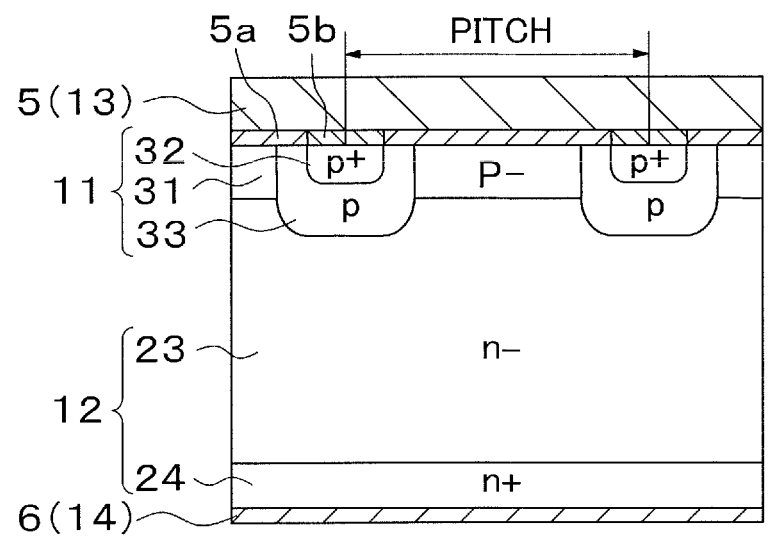
FIG. 2 is a sectional view of a diode according to a first comparative example.

FIG. 2 is a sectional view of a diode 2a according to a first comparative example. The diode 2a of FIG. 2 is provided with an anode region 11 and a cathode region 12. The anode region 11 has a p$^{-}$-type diffusion layer 31, a plurality of p$^{+}$-type diffusion layers 32 arranged apart from one another in the p$^{-}$-type diffusion layer 31, and a plurality of p-type diffusion layers 33 arranged in a deep region in a manner to surround the plurality of p$^{+}$-type diffusion layers 32, respectively. The cathode region 12 has the same layer structure as that of FIG. 1.

Figure 3:
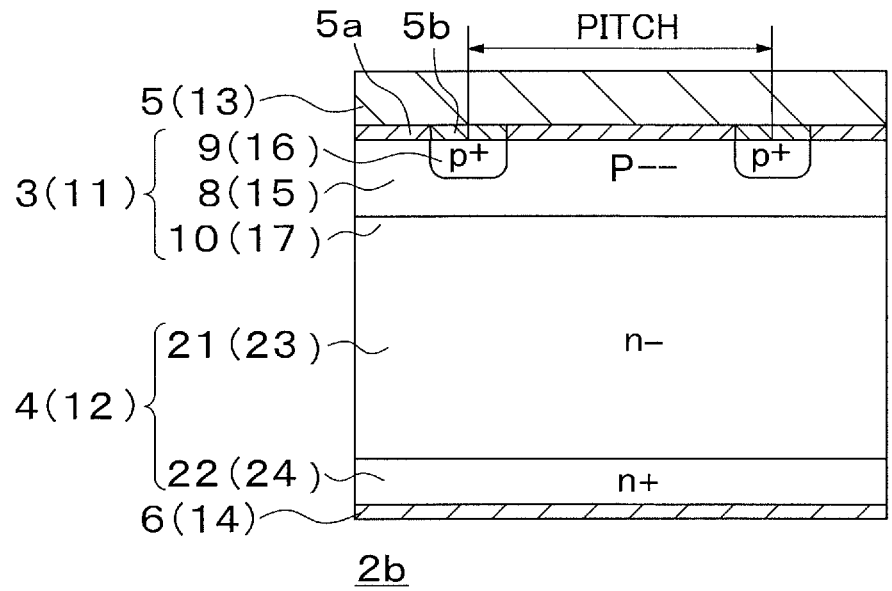
FIG. 3 is a sectional view of a diode according to a second comparative example.
Figure 4:
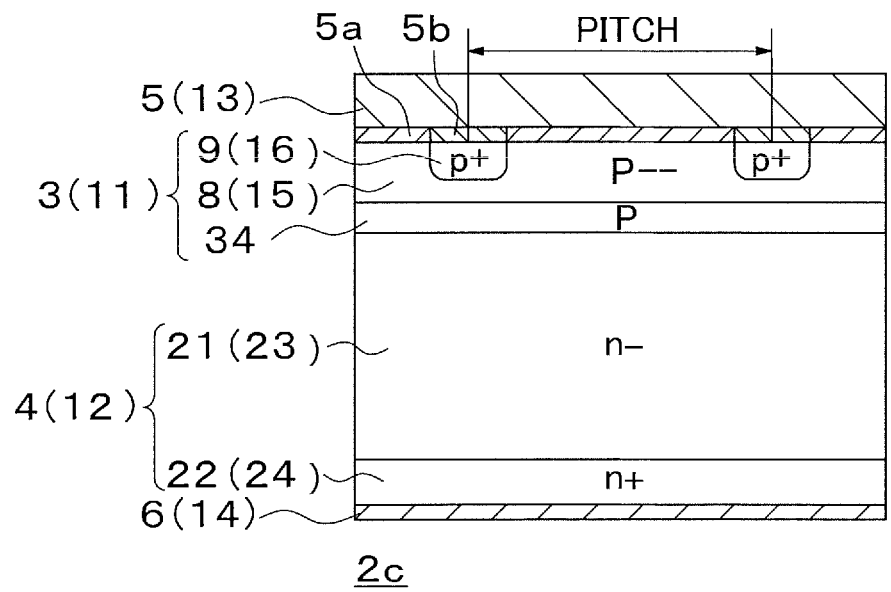
FIG. 4 is a sectional view of a diode according to a third comparative example.

FIG. 3 is a sectional view of a diode 2b according to a second comparative example. The diode 2b of FIG. 3 has the same configuration as the diode 2 of FIG. 1, except that the plurality of p-type diffusion layers 17 shown in FIG. 1 are omitted. FIG. 4 is a sectional view of a diode 2c according to a third comparative example. The diode 2c of FIG. 4 has the same configuration as the diode 2b of FIG. 3, except that a single monolithic p-type diffusion layer 34 is provided along the pn-junction interface 7. The diode 2c of FIG. 4 is different from the diode 2 of FIG. 1 in that the p-type diffusion layer 34 has no gaps.

Figure 5:
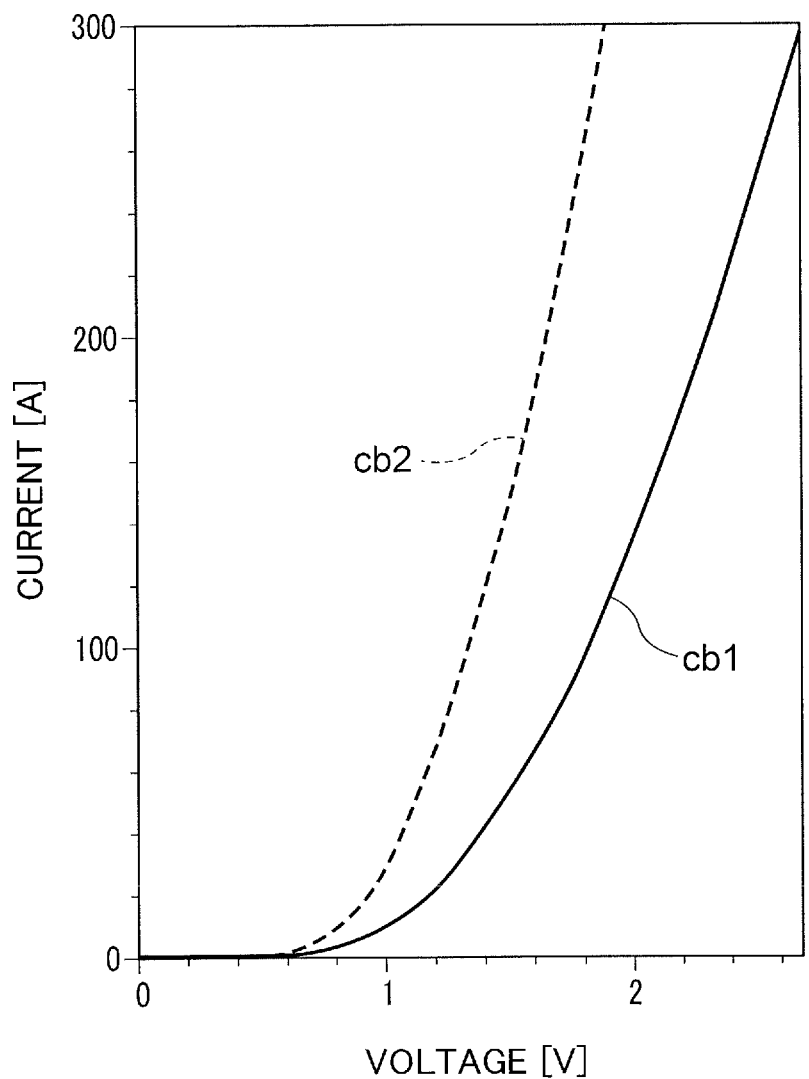
FIG. 5 is a drawing for comparing forward characteristics between the diodes of FIGS. 2 and 3.

FIG. 5 is a drawing for comparing forward characteristics between the diode 2a of FIG. 2 and the diode 2b of FIG. 3. In FIG. 5, the abscissa and ordinate are an anode-to-cathode forward voltage [V] and an anode-to-cathode current [A], respectively. Curves cb1 and cb2 shown in FIG. 5 indicate the forward characteristics of the diode 2b of FIG. 3 and of the diode 2a of FIG. 2, respectively. As shown in FIG. 5, by providing the p$^{--}$-type diffusion layer 15 to set the anode region 11 to be low concentration, a hole injection amount from the anode region 11 is decreased to increase the forward voltage, thereby shortening a reverse recovery time.

Figure 6:
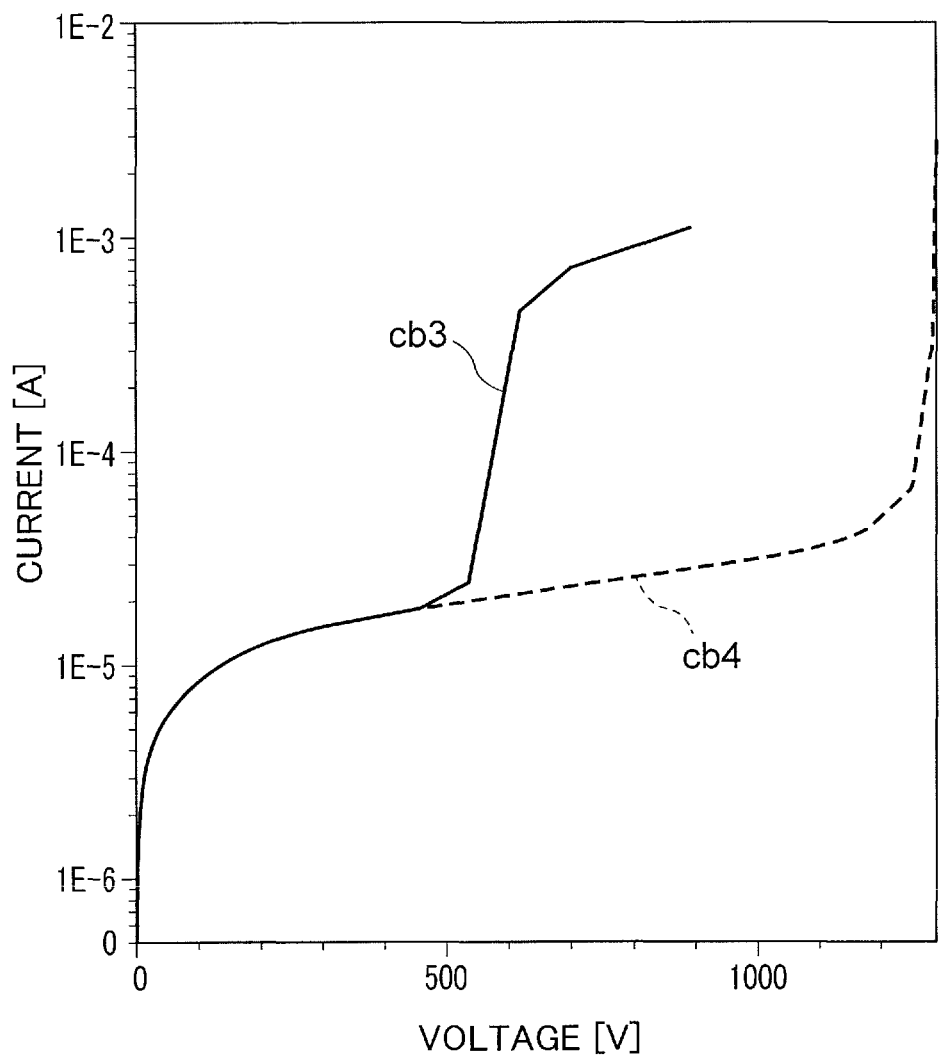
FIG. 6 is a drawing for comparing reverse characteristics between the diodes of FIGS. 2 and 3.

FIG. 6 is a drawing for comparing reverse characteristics between the diode 2a of FIG. 2 and the diode 2b of FIG. 3.

In FIG. 6, the abscissa and ordinate are an anode-to-cathode reverse voltage [V] and an anode-to-cathode current [A], respectively. Curves cb3 and cb4 shown in FIG. 6 indicate the reverse characteristics of the diode 2b of FIG. 3 and of the diode 2a of FIG. 2, respectively. As shown in FIG. 6, break down occurs at a lower reverse voltage only by setting the anode region 11 to be low concentration. Therefore, there is a problem of lowering the break down voltage just by setting the anode region 11 to be low concentration.

Figure 7A:
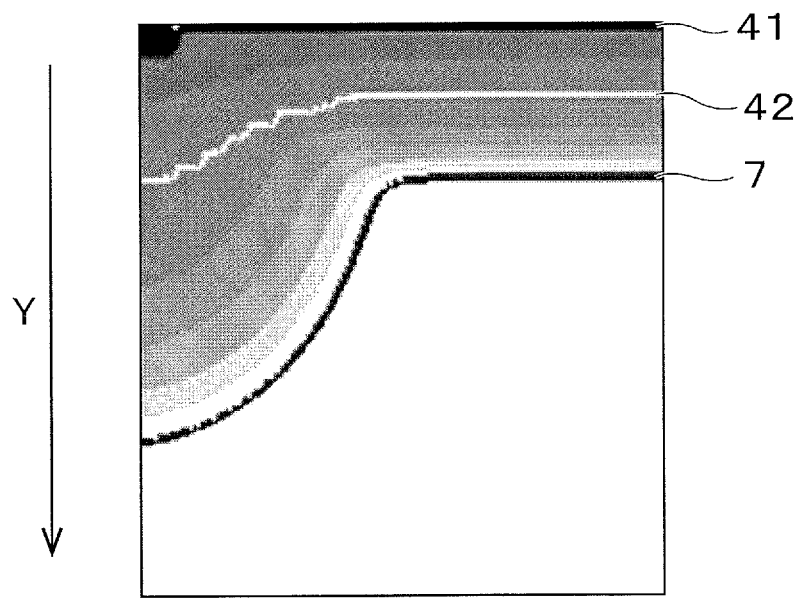
FIG. 7A is a drawing showing a depletion layer edge at the time of applying the reverse voltage to the diode of FIG. 2.
Figure 7B:
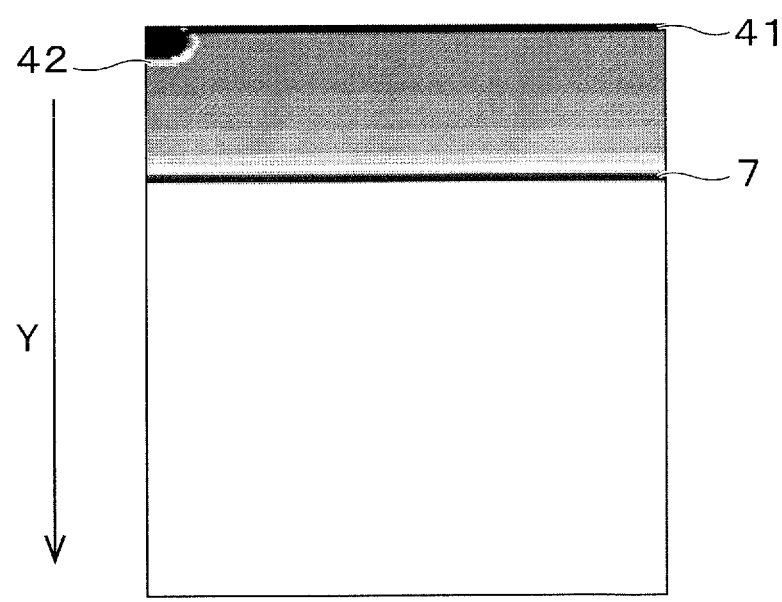
FIG. 7B is a drawing showing a depletion layer edge at the time of applying the reverse voltage to the diode of FIG. 3.

FIG. 7A is a drawing showing a depletion layer edge 42 at the time of applying the reverse voltage to the diode 2a of FIG. 2. FIG. 7B is a drawing showing a depletion layer edge 42 at the time of applying the reverse voltage to the diode 2b of FIG. 3. The ordinate in FIGS. 7A and 7B indicates a distance Y from a contact surface 41 contacting the anode electrode 13 in a depth direction of the diodes 2a and 2b, respectively. The upper end of the ordinate is the contact surface 41 contacting the anode electrode 13. The abscissa in FIGS. 7A and 7B is a distance in the diodes 2a and 2b, respectively, in a direction along the pn-junction interface 7. In the diode 2a of FIG. 2, the anode region 11 is the p$^-$-type diffusion layer 31, having a comparatively lot of holes, so that the depletion layer edge 42 does not reach the contact surface 41 when a reverse voltage is applied. By contrast, in the diode 2b of FIG. 3, the anode region 11 is the p$^{--}$-type diffusion layer 15 of low concentration, having a small amount of holes, so that the depletion layer edge 42 reaches the contact surface 41 when a reverse voltage is applied, to allow the flow of a reverse current which lowers the break down voltage, as shown by the curve cb3 of FIG. 6.

Figure 8A:
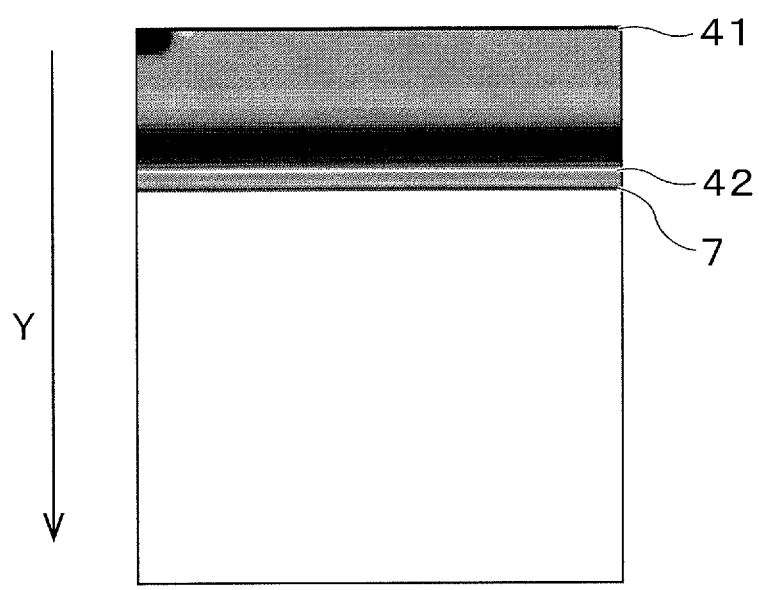
FIG. 8A is a drawing showing a depletion layer edge at the time of applying the reverse voltage to the diode of FIG. 4.
Figure 8B:
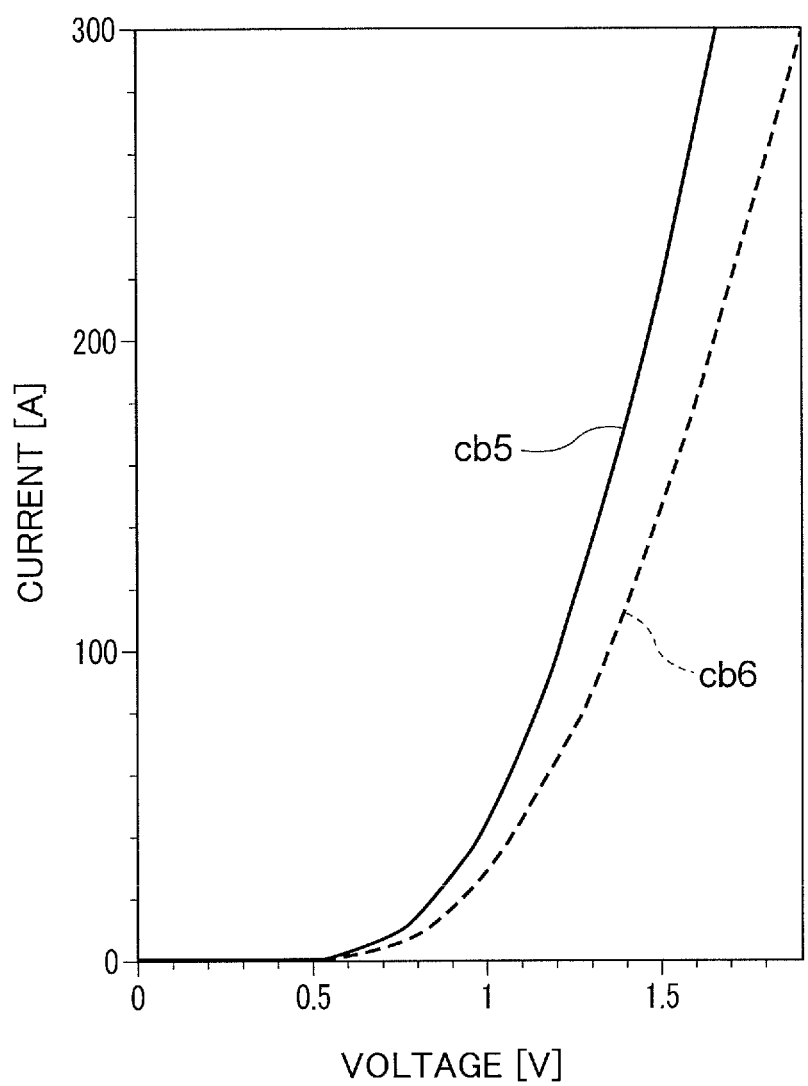
FIG. 8B is a drawing for comparing forward characteristics between the diodes of FIGS. 2 and 4.

FIG. 8A is a drawing showing a depletion layer edge 42 at the time of applying the reverse voltage to the diode 2c of FIG. 4. FIG. 8B is a drawing for comparing forward characteristics between the diode 2a of FIG. 2 and the diode 2c of FIG. 4. Curves cb5 and cb6 in FIG. 8B indicate the forward characteristics of the diode 2c of FIG. 4 and of the diode 2a of FIG. 2, respectively. By providing the single monolithic p-type diffusion layer 34 along the pn-junction interface 7 as shown in FIG. 4, the depletion layer does not spread toward the anode region 11, beyond the p-type diffusion layers 34 at the time of applying the reverse voltage, so that the depletion layer edge 42 is disposed along the p-type diffusion layers 34, which raises the break down voltage. However, in the diode 2c of FIG. 4, electrons from the cathode region 12 cannot flow to the anode region 11 at the time of applying the forward voltage due to the presence of the p-type diffusion layer 34, and hence the electrons are charged in the active layer 21, together with about the same amount of holes being charged in the active layer 21 to satisfy charge neutralization. Therefore, as shown in FIG. 8B, the diode 2c of FIG. 4 shows almost similar forward characteristics to the diode 2a of FIG. 2. Accordingly, it is a problem of the diode 2c of FIG. 4 that the reverse recovery time cannot be shortened.

Figure 9:
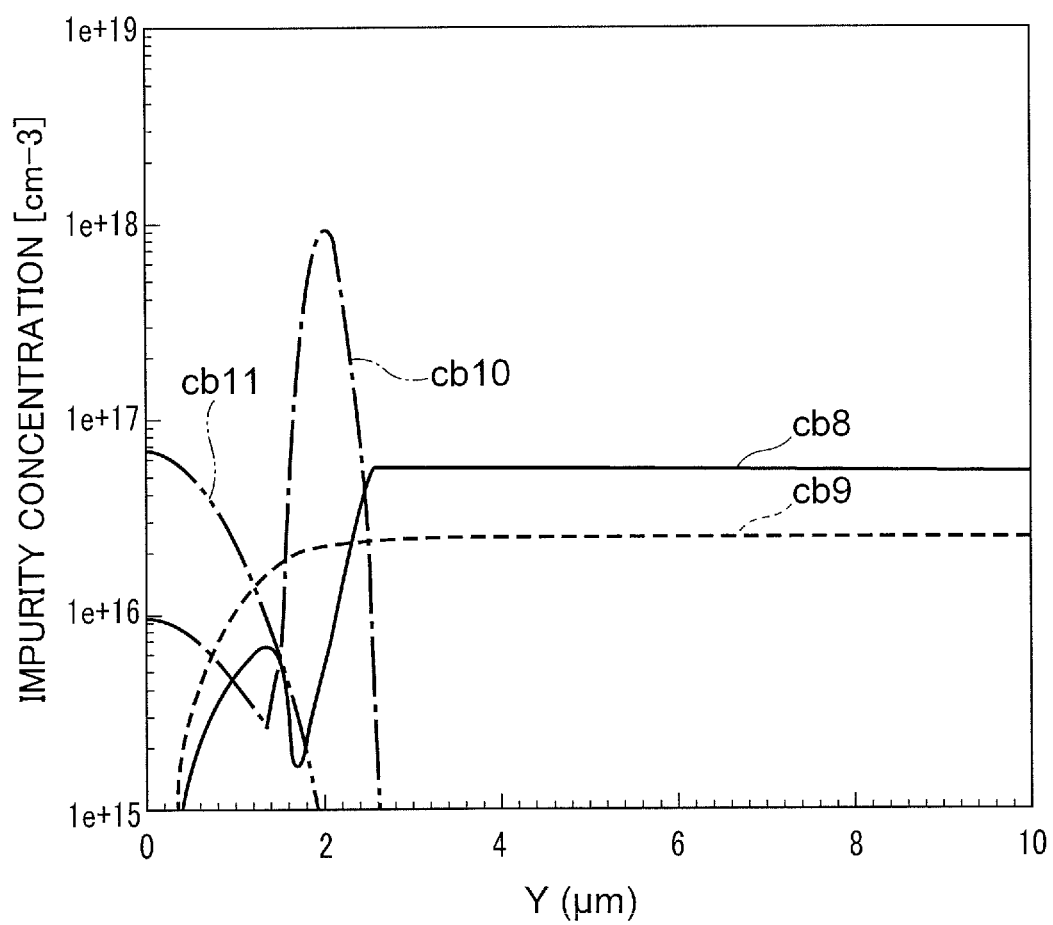
FIG. 9 is a drawing for comparing carrier profile in the vicinity of an anode region between the diodes of FIGS. 2 and 4.

FIG. 9 is a drawing for comparing carrier profile in the vicinity of the anode region 11 between the diode 2a of FIG. 2 and the diode 2c of FIG. 4 at the time of applying the forward voltage. The abscissa in FIG. 9 is a distance Y [μm] from the contact surface 41 contacting the anode electrode 13 in a depth direction of the diodes 2a and 2c. The ordinate in FIG. 9 is impurity concentration [cm$^{-3}$].

In FIG. 9, curves cb8 and cb9 are electron concentration of the diode 2c of FIG. 4 and of the diode 2a of FIG. 2, respectively, and curves cb10 and cb11 are impurity concentration of the diode 2c of FIG. 4 and of the diode 2a of FIG. 2, respectively. The diode 2c of FIG. 4 has the single monolithic p-type diffusion layer 34 along the pn-junction interface 7. Therefore, the diode 2c of FIG. 4 has higher electron concentration as shown by the curve cb8 which is plotted higher than the curve cb9.

Figure 10:
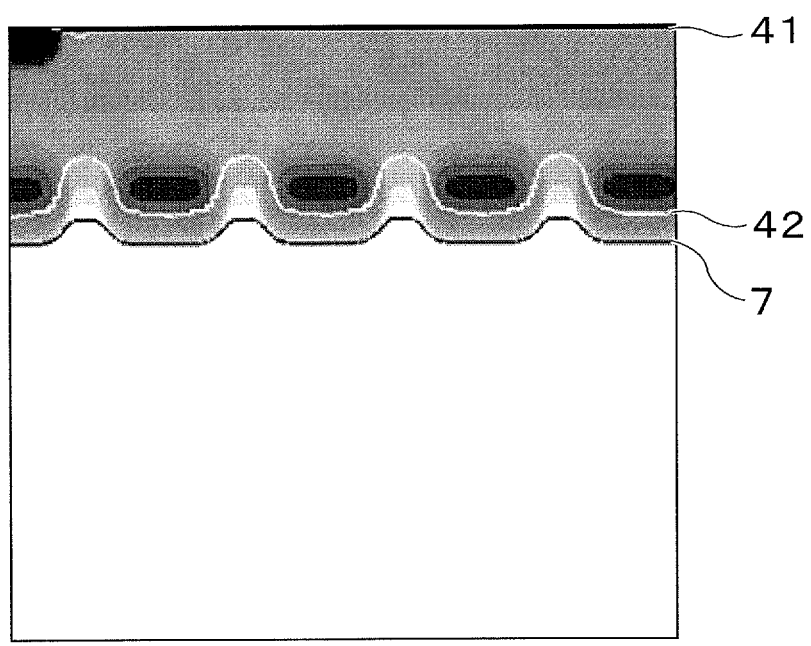
FIG. 10 is a drawing showing a depletion layer edge at the time of applying the reverse voltage to the diode according to the present embodiment shown in FIG. 1.

FIG. 10 is a drawing showing a depletion layer edge 42 at the time of applying the reverse voltage to the diode 2 according to the present embodiment shown in FIG. 1. The diode 2 of FIG. 1 has gaps each provided between successive p-type diffusion layers 17 along the pn-junction interface 7. Through the gaps, electrons flow from the n$^-$-type substrate layer 23 in the cathode region 12 to the p$^{--}$-type diffusion layer 15 in the anode region 11 at the time of applying the forward voltage. Therefore, the active layer 21 has an appropriate amount of electrons, together with an appropriate amount of holes to keep charge neutralization. In addition, the depletion layer edge 42 does not contact the anode electrode 13 when a reverse voltage is applied, which raises the break down voltage. As shown in FIG. 10, when a reverse voltage is applied, the depletion layer edge 42 is disposed a little bit closer to the anode electrode 13 in the areas where the gaps of the p-type diffusion layers 17 are present whereas disposed along the p-type diffusion layers 17 in the areas where the p-type diffusion layers 17 are present with no gaps.

Figure 11:
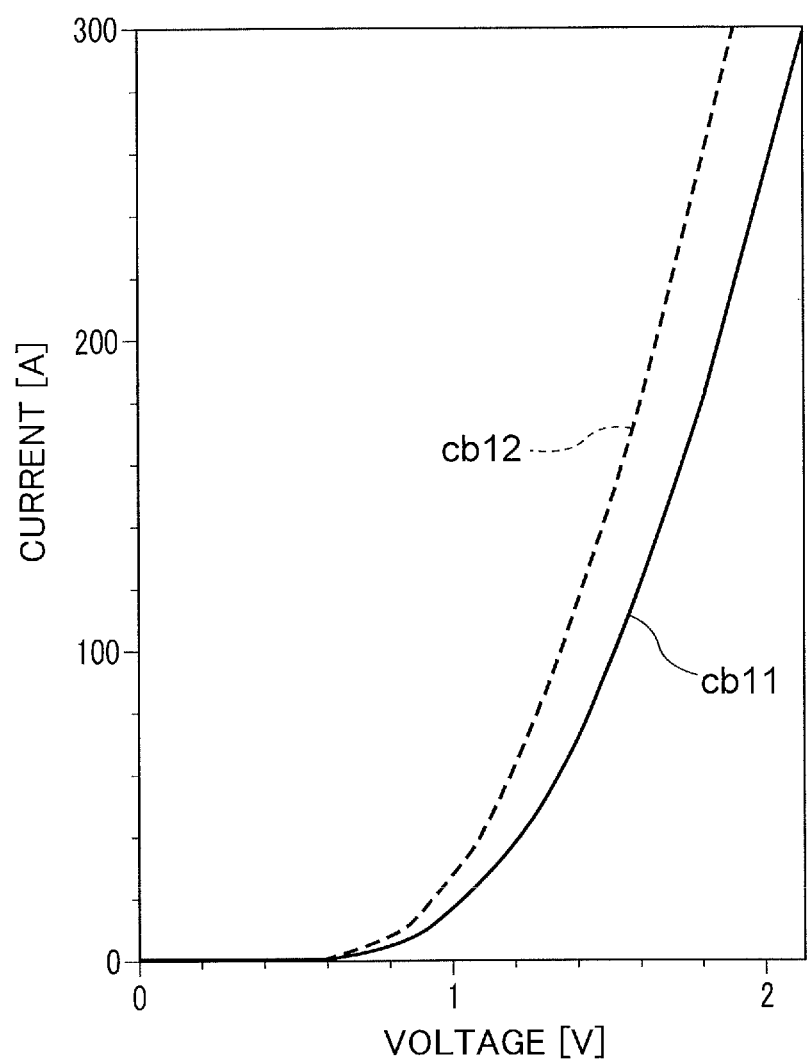
FIG. 11 is a drawing for comparing forward characteristics between the diodes of FIGS. 1 and 2.

FIG. 11 is a drawing for comparing forward characteristics between the diode 2 of FIG. 1 and the diode 2a of FIG. 2. Curves cb11 and cb12 shown in FIG. 11 indicate the forward characteristics of the diode 2 of FIG. 1 and of the diode 2a of FIG. 2, respectively. As understood from the curves cb11 and cb12, the amount of holes, which are charged in the n$^-$-type active layer 21 that is the cathode region 12, is smaller in the diode 2 of FIG. 1 than in the diode 2a of FIG. 2. Therefore, the forward voltage of the diode 2 of FIG. 1 is higher than that of the diode 2a of FIG. 2, which shortens the reverse recovery time.

Figure 12:
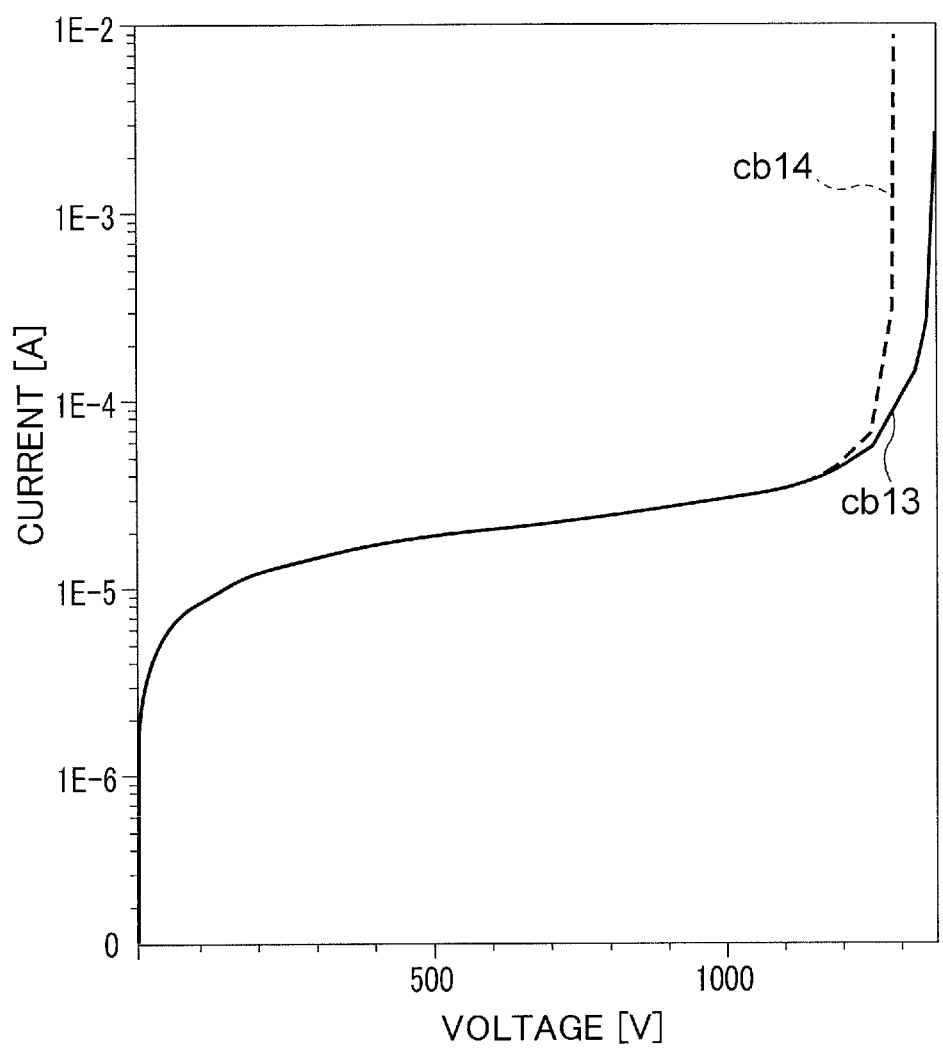
FIG. 12 is a drawing for comparing reverse characteristics between the diodes of FIGS. 1 and 2.

FIG. 12 is a drawing for comparing reverse characteristics between the diode 2 of FIG. 1 and the diode 2a of FIG. 2. Curves cb13 and cb14 shown in FIG. 12 indicate the reverse characteristics of the diode 2 of FIG. 1 and of the diode 2a of FIG. 2, respectively. There is almost no difference in the reverse characteristics between the diode 2 of FIG. 1 and the diode 2a of FIG. 2. It is understood that the diode 2 of FIG. 1 has an almost same breakdown voltage as the diode 2a of FIG. 2.

Figure 13A:
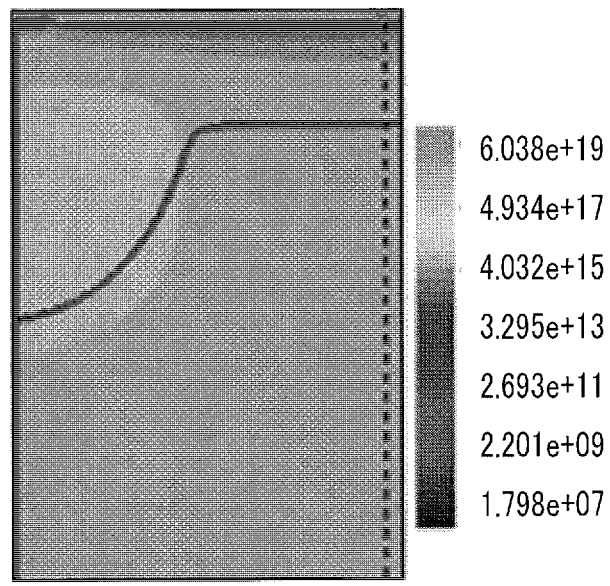
FIG. 13A is a drawing showing electron concentration distribution in the diode of FIG. 2.
Figure 13B:
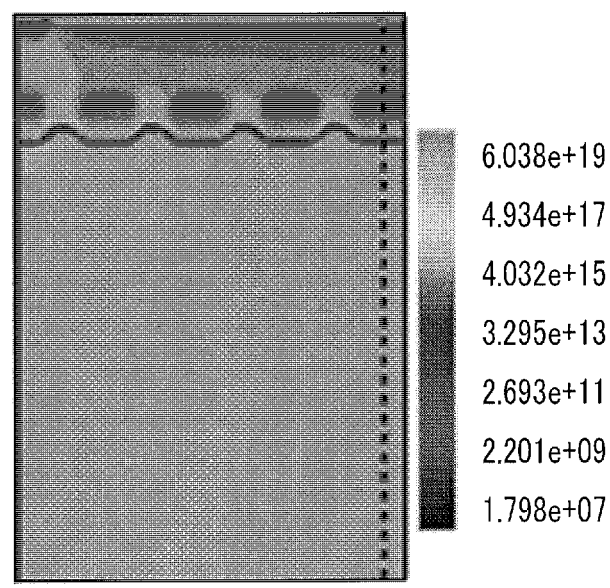
FIG. 13B is a drawing showing electron concentration distribution in the diode of FIG. 1.

FIGS. 13A and 13B are drawings showing electron concentration distribution in the diode 2a of FIG. 2 and in the diode 2 of FIG. 1, respectively. In FIGS. 13A and 13B, a lighter portion in a shaded illustration indicates higher electron concentration. In FIG. 13B, electron concentration is higher in the gaps of the p-type diffusion layers 17, because electrons pass through the gaps to enter toward the anode electrode 13 at the time of applying the forward voltage.

Figure 14:
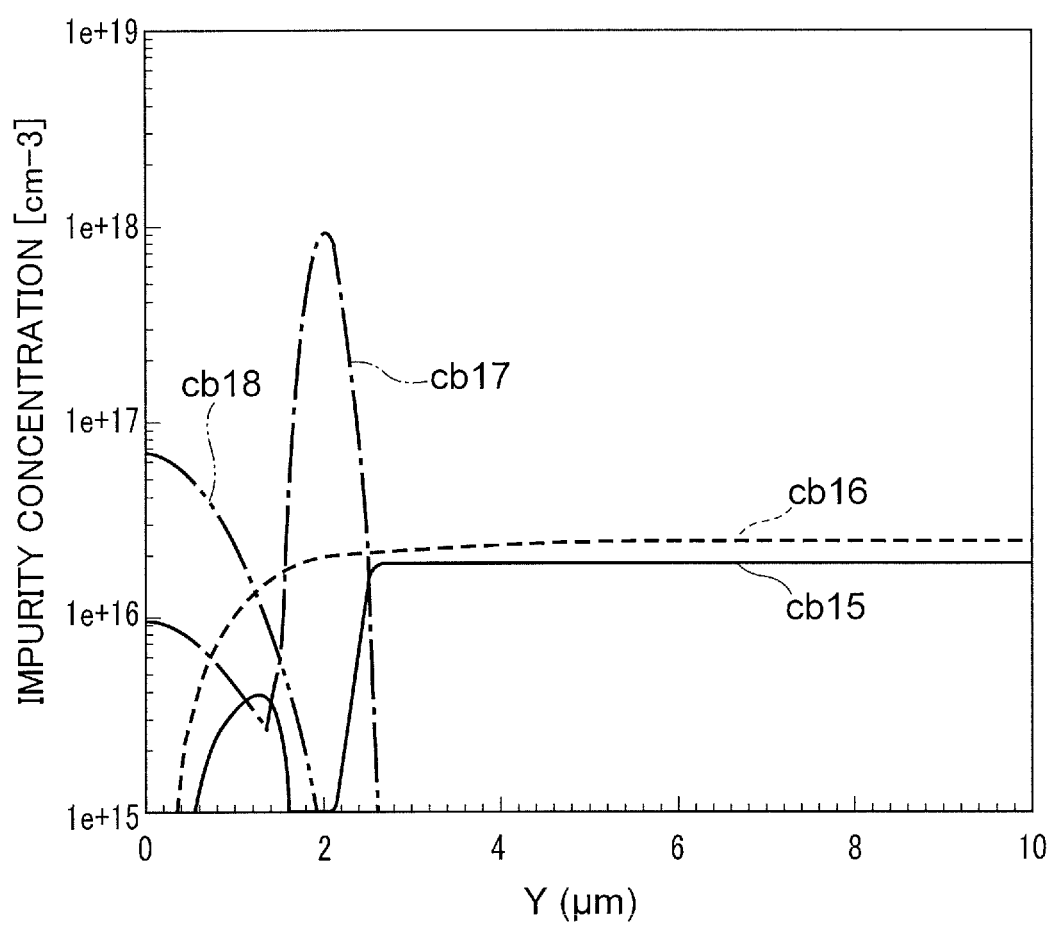
FIG. 14 is a drawing for comparing carrier profile in the vicinity of an anode region between the diodes of FIGS. 1 and 2.

FIG. 14 is a drawing for comparing carrier profile in the vicinity of the anode region 11 between the diode 2 of FIG. 1 and the diode 2a of FIG. 2. In FIG. 14, curves cb15 and cb16 are electron concentration of the diode 2 of FIG. 1 and of the diode 2a of FIG. 2, respectively, and curves cb17 and cb18 are impurity concentration of the diode 2 of FIG. 1 and of the diode 2a of FIG. 2, respectively.

As shown in FIG. 14, electron concentration on the cathode region 12's side in the diode 2 of FIG. 1 is lower than that of FIG. 2. In the diode 2 of FIG. 1, electrons are charged at appropriate concentration on the cathode region 12's side, which is different from the carrier profile of FIG. 9. The electron concentration lowers after that electrons enter the p$^{--}$-type diffusion layer 15, after passing through the gaps of the p-type diffusion layers 17. Since the p-type diffusion layers 17 function as a stopper, a depletion layer does not spread in the p⁻⁻⁻-type diffusion layer 15.

Figure 15:
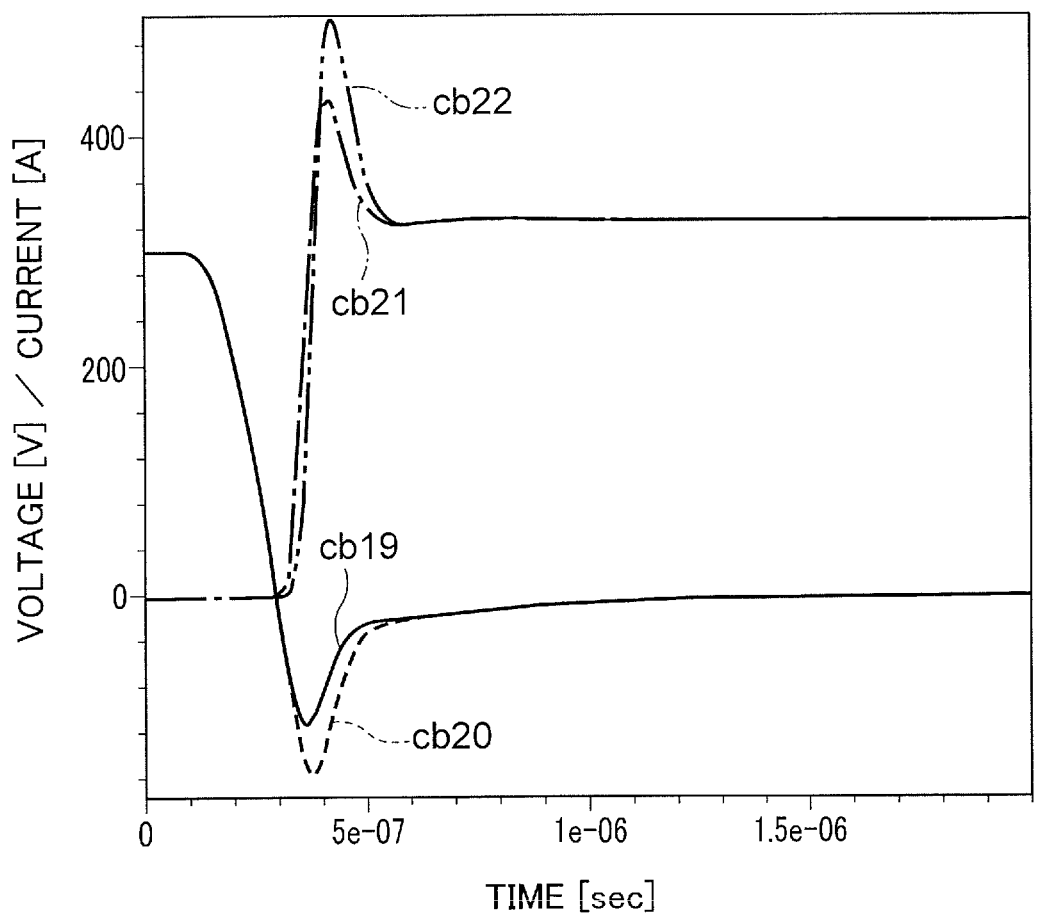
FIG. 15 is a drawing showing reverse recovery characteristics of the diodes of FIGS. 1 and 2.

FIG. 15 is a drawing showing reverse recovery characteristics of the diode 2 of FIG. 1 and of the diode 2a of FIG. 2. The reverse recovery characteristics show current or voltage change with time when a diode, which has been turned on, is turned off. In FIG. 15, the abscissa is time [sec] and the ordinate is voltage [V] or current [A]. Curves cb19 and cb20 in FIG. 15 indicate the current change with time in the diode 2 of FIG. 1 and in the diode 2a of FIG. 2, respectively. Curves cb21 and cb22 in FIG. 15 indicate the voltage change with time in the diode 2 of FIG. 1 and in the diode 2a of FIG. 2, respectively.

The amount of holes to be charged in the n⁻-type active layer 21, which is the cathode region 12, is smaller in the diode 2 of FIG. 1 than in the diode 2a of FIG. 2. Therefore, as shown in FIG. 15, current and voltage overshoots (under shoots) in reverse recovery are smaller in the diode 2 of FIG. 1. It is found that the diode 2 of FIG. 1 is more excellent in the reverse recovery characteristics than the diode 2a of FIG. 2.

Subsequently, a fabrication method of the diode 2 in FIG. 1 will be explained. First of all, p-type impurity ions, such as boron, are implanted into an n⁻-type bare silicon substrate, with thermal diffusion, to form a p⁻⁻⁻-type diffusion layer 15. Subsequently, p-type impurity ions, such as boron, are deeply implanted, with thermal activation, to form a plurality of p-type diffusion layers 17. Thereafter, p-type impurity ions, such as boron, are shallowly implanted to form a plurality of p⁺-type diffusion layers 16. A first conductive layer 5 is finally formed with a material such as aluminum. Whether ohmic contact or Schottky contact is made depends only on the degree of impurity concentration. The silicon substrate is then turned upside down and implanted with n-type impurity ions, such as As, with thermal diffusion, to have an n⁺-type diffusion layer 24 and then a second conductive layer 6 with a material of, for example, aluminum, formed thereon.

The semiconductor device 1 is the diode 2 in the example described above. However, the semiconductor device 1 may be a combination of the diode 2 and other various types of semiconductor elements. For example, the semiconductor device 1 may be a combination of the diode 2 and an IGBT of a reverse conductivity type to the diode 2, which achieves functions of the IGBT and diode with one chip, having improved diode electrical characteristics as described above.

As described above, in the first embodiment, the p⁻⁻⁻-type diffusion layer 15 of low concentration is provided in the anode region 11, together with the p-type diffusion layers 17 arranged separately from one another along the pn-junction interface 7. Therefore, electrons in the cathode region 12 can enter the p⁻⁻⁻-type diffusion layer 15, after passing through the gaps of the p-type diffusion layers 17, so that holes are not accumulated in the n⁻-type active layer 21, which improves the reverse recovery characteristics. Moreover, by providing the p-type diffusion layers 17, the depletion layer edge 42 does not reach the anode electrode 13 when a reverse voltage is applied. Therefore, it is possible to raise the breakdown voltage of the diode 2 at the time of applying the reverse voltage. Accordingly, according to the diode 2 of FIG. 1, it is possible to improve both of the reverse recovery characteristics and the breakdown characteristics.

Second Embodiment

In the diode 2 of FIG. 1, the p⁺-type diffusion layers 16 are provided to adjust the amount of holes in the p⁻⁻⁻-type diffusion layer 15. The pitch L2 of the p-type diffusion layers 17 arranged to be included in or to contact the p⁻⁻⁻-type diffusion layer 15 is adjusted in accordance with the amount of electrons that enter the anode region 11 from the cathode region 12. Accordingly, the pitch L1 of the p⁺-type diffusion layers 16 and the pitch L2 of the p-type diffusion layers 17 are optimized under different electrical characteristics. Therefore, there is no correlation among distances between the p⁺-type diffusion layers 16 and the p-type diffusion layers 17 in areas in plane (in the cross sectional surface shown in FIG. 1) of the diode 2, the distance being different in areas in plane. When the distance between the p⁺-type diffusion layers 16 and the p-type diffusion layers 17 varies depending on the areas in the cross sectional surface, the current density varies depending on the areas in the cross sectional surface. However, the total current flowing through the diode 2 between the anode electrode 13 and the cathode electrode 14 is the integration of current flowing through all cross sectional surfaces. Therefore, even if the current density varies depending on the areas in each cross sectional surface, the total current density is uniform between the anode electrode 13 and the cathode electrode 14 in all of the cross sectional surfaces.

However, since the current density varies depending on the areas in respective sections, there are areas where the current density is high and low in each sectional surface. At the area of higher current density, degradation of the diode 2 proceeds, and hence the diode 2 is damaged more easily when there is in-plane variation in current density, that is, the life of the diode 2 becomes shorter. From this background, the second embodiment aims to provide a diode 2 with no in-plane variation in current density.

Figure 16:
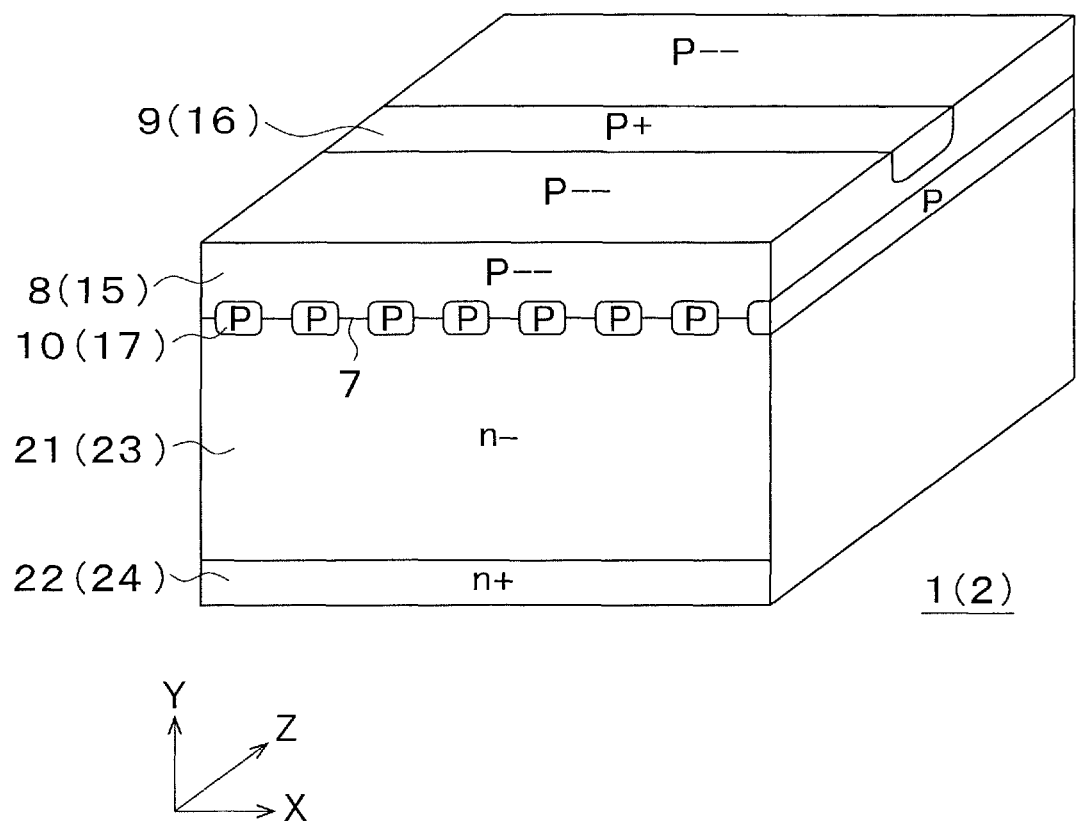
FIG. 16 is a schematic view of main portions of a semiconductor device in cross sectional surface according to a second embodiment.

FIG. 16 is a schematic view of main portions of a semiconductor device 1 in cross sectional surface according to the second embodiment. The semiconductor device 1 of FIG. 16 is, for example, a diode 2. The diode 2 of FIG. 16 has the same configuration as the diode 2 of FIG. 1, except for the direction in which the p⁺-type diffusion layers 16 are arranged, the direction being different by 90 degrees. Although FIG. 16 shows just one p⁺-type diffusion layer 16, actually, in the same manner as in FIG. 1, a plurality of p⁺-type diffusion layers 16 are arranged at a predetermined pitch in a Z-direction of FIG. 16. In the same manner as the first embodiment, by controlling the pitch of the p⁺-type diffusion layers 16, the amount of holes injected into the p⁻⁻⁻-type diffusion layer 15, which is the anode region 11, can be adjusted.

The distance between the p⁺-type diffusion layers 16 and the p-type diffusion layers 17 is constant in any areas in the same cross sectional surface in XY-directions of FIG. 16. Therefore, the current density of the diode 2 in cross sectional surface of FIG. 16 is constant irrespective of areas in cross sectional surface. Accordingly, the diode 2 of FIG. 16 has no in-plane variation in current density, and hence has a longer life than the diode 2 of FIG. 1.

It is ideally preferable to arrange the p⁺-type diffusion layers 16 so that the longitudinal direction of the p⁺-type diffusion layers 16 is different by 90 degrees from the longitudinal direction of the p-type diffusion layers 17. However, as long as the p⁺-type diffusion layers 16 are arranged so that the longitudinal direction of the p⁺-type diffusion layers intersects with the longitudinal direction of the p-type diffusion layers 17, in-plane variation in current density is more restricted than in the case where both layers are arranged in the same direction. Therefore, it is not always necessary that the longitudinal direction of the p⁺-type diffusion layers 16 and the longitudinal direction of the p-type diffusion layers 17 are orthogonal to each other.

As described above, in the second embodiment, the p⁺-type diffusion layers 16 are arranged so that the longitudinal direction of the p⁺-type diffusion layers 16 intersects with the longitudinal direction of the p-type diffusion layers 17. Therefore, in-plane variation in current density of the diode 2 depending on areas in plane can be restricted so that there are no areas where current density is higher than the other areas, and hence the life of the diode 2 can be lengthened.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first semiconductor region of a first conductivity type;
a second semiconductor region of a second conductivity type;
a first conductive layer disposed on a main surface of the first semiconductor region at an opposite side of a junction interface between the first and second semiconductor regions; and
a second conductive layer disposed on a main surface of the second semiconductor region at an opposite side of the junction interface,
wherein the first conductive layer comprises:
a first diffusion layer of the first conductivity type;
a plurality of second diffusion layers of the first conductivity type arranged apart from one another at portions of the first diffusion layer, the second diffusion layers having higher impurity concentration than the first diffusion layer; and
a plurality of third diffusion layers of the first conductivity type that are included in the first semiconductor region, or are arranged apart from one another to contact the first and second semiconductor regions, the third diffusion layers being arranged apart from the plurality of second diffusion layers and having higher impurity concentration than the first diffusion layer,
wherein the impurity concentration of the second diffusion layers is higher than the impurity concentration of the third diffusion layers.

2. The semiconductor device of claim 1, wherein the plurality of second diffusion layers are arranged from a surface at the first conductive layer side of the first diffusion layer until a first depth; and
the third diffusion layers are arranged from a second depth deeper than the first depth of the first diffusion layer toward the second semiconductor region side.

3. The semiconductor device of claim 1, wherein the second diffusion layers are arranged so that a longitudinal direction of the second diffusion layers intersects with a longitudinal direction of the third diffusion layers.

4. The semiconductor device of claim 1, wherein the first and second diffusion layers are electrically connected to the first conductive layer.

5. The semiconductor device of claim 1 further comprising an IGBT (Insulated Gate Bipolar Transistor) region.

6. The semiconductor device of claim 1, wherein the first conductive layer is connected to the first diffusion layer by Schottky contact and to the second diffusion layers by ohmiccontact.

7. The semiconductor device of claim 1, wherein the third diffusion layers are arranged along the junction interface between the first and second semiconductor regions.

8. The semiconductor device of claim 7, wherein when a forward voltage is applied between the first semiconductor region and the second semiconductor region, at least part of electrons accumulated in the second semiconductor region passes through gaps of the third diffusion layers to enter the first semiconductor region.

9. A semiconductor device comprising:
a first semiconductor region of a first conductivity type;
a second semiconductor region of a second conductivity type;
a first conductive layer disposed on a main surface of the first semiconductor region at an opposite side of a junction interface between the first and second semiconductor regions; and
a second conductive layer disposed on a main surface of the second semiconductor region at an opposite side of the junction interface,
wherein the first conductive layer comprises:
a first diffusion layer of the first conductivity type;
a plurality of second diffusion layers of the first conductivity type arranged apart from one another at portions of the first diffusion layer, the second diffusion layers having higher impurity concentration than the first diffusion layer; and
a plurality of third diffusion layers of the first conductivity type that are included in the first semiconductor region, or are arranged apart from one another to contact the first and second semiconductor regions, the third diffusion layers being arranged apart from the plurality of second diffusion layers and having higher impurity concentration than the first diffusion layer,
wherein the third diffusion regions have a narrower pitch than the second diffusion layers.

10. A diode comprising:
an anode region of a first conductivity type;
a cathode region of a second conductivity type;
an anode electrode disposed on a main surface of the anode region at an opposite side of a junction interface between the anode and cathode regions; and
a cathode electrode disposed on a main surface of the cathode region at an opposite side of the junction interface,
wherein the anode region comprises:
a first diffusion layer of the first conductivity type;
a plurality of second diffusion layers of the first conductivity type arranged apart from one another at portions of the first diffusion layer, the second diffusion layers having higher impurity concentration than the first diffusion layer; and
a plurality of third diffusion layers of the first conductivity type that are included in the anode region, or are arranged apart from one another to contact the anode and cathode regions, the third diffusion layers being arranged apart from the plurality of second diffusion layers and having higher impurity concentration than the first diffusion layer,
wherein the impurity concentration of the second diffusion layers is higher than the impurity concentration of the third diffusion layers.

11. The diode of claim 10, wherein the plurality of second diffusion layers are arranged from a surface at an anode electrode side of the first diffusion layer until a first depth; and the third diffusion layers are arranged from a second depth deeper than the first depth of the first diffusion layer toward a cathode region side.

12. The diode of claim 10, wherein the second diffusion layers are arranged so that a longitudinal direction of the second diffusion layers intersects with a longitudinal direction of the third diffusion layers.

13. The diode of claim 10, wherein the first and second diffusion layers are electrically connected to the anode electrode.

14. The diode of claim 10, wherein the anode electrode is connected to the first diffusion layer by Schottky contact and to the second diffusion layers by ohmic contact.

15. The diode of claim 10, wherein the third diffusion layers are arranged along the junction interface between the anode and cathode regions.

16. The diode of claim 15, wherein when a forward voltage is applied between the anode region and the cathode region, at least part of electrons accumulated in the cathode region passes through gaps of the third diffusion layers to enter the anode region.

17. The diode of claim 10, wherein the third diffusion regions have a narrower pitch than the second diffusion layers.

* * * * *